(12) United States Patent
Parthasarathy et al.

(10) Patent No.: US 7,145,232 B2
(45) Date of Patent: Dec. 5, 2006

(54) CONSTRUCTION TO IMPROVE THERMAL PERFORMANCE AND REDUCE DIE BACKSIDE WARPAGE

(75) Inventors: Rajagopalan Parthasarathy, Milpitas, CA (US); Kishore Desai, Fremont, CA (US); Yogendra Ranade, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/954,940

(22) Filed: Sep. 30, 2004

(65) Prior Publication Data

US 2006/0071327 A1    Apr. 6, 2006

(51) Int. Cl.
*H01L 23/34* (2006.01)

(52) U.S. Cl. .............. 257/720; 257/706; 438/122

(58) Field of Classification Search ............. 257/706, 257/720; 438/122
See application file for complete search history.

(56) References Cited

U.S. PATENT DOCUMENTS

| 4,654,966 | A | * | 4/1987 | Kohara et al. ............... 29/840 |
| 5,744,863 | A | * | 4/1998 | Culnane et al. ............. 257/712 |
| 5,866,943 | A | * | 2/1999 | Mertol ....................... 257/712 |
| 6,323,066 | B1 | * | 11/2001 | Lai et al. .................... 438/122 |
| 6,472,762 | B1 | * | 10/2002 | Kutlu ......................... 257/778 |
| 6,590,292 | B1 | * | 7/2003 | Barber et al. ............... 257/778 |
| 6,681,482 | B1 | * | 1/2004 | Lischner et al. ............. 29/840 |
| 2005/0224955 | A1 | * | 10/2005 | Desai et al. ................ 257/706 |

* cited by examiner

*Primary Examiner*—Andy Huynh
(74) *Attorney, Agent, or Firm*—Trexler, Bushnell, Giangiorgi, Blackstone & Marr, Ltd.

(57) ABSTRACT

A semiconductor package construction aimed at improving thermal performance. A heatspreader is provided having a metal alloy preform attached to it already. Then, a few dots of conductive epoxy are dispensed around the die. The heatspreader with the preformed metal alloy is pressed on the adhesive and then the part is cured. By coupling the die to the heatspreader with conductive epoxy, the die is constrained from warping. By removing the necessity of coating the die, the cost of fabrication is reduced. There is only a very marginal cost increase in the back end for dispensing the dots. For this, the process and equipment already exists in the backend. By reducing die backside warpage due, the die remains in good contact with the heatspreader, thus improving thermal performance.

14 Claims, 1 Drawing Sheet

CONSTRUCTION TO IMPROVE THERMAL PERFORMANCE AND REDUCE DIE BACKSIDE WARPAGE

BACKGROUND

The present invention generally relates to semiconductor packages, and more specifically relates to a semiconductor package construction aimed at improving thermal performance.

To improve the thermal performance of a flipchip semiconductor package, a few companies are adding metal alloys between the heatspreader and the die, as the metal alloys conduct heat better than the heatspreader. The metal alloys are metallurgically bonded to the heatspreader and the silicon (i.e., on the die). To get the metallurgical bonding, a coating is needed on the silicon so that a bondable surface is provided for the metal alloy to form a metallurgical bond. The problem with this approach is that today's semiconductor fabrication laboratories are not equipped in terms of both equipment and process to provide the coating which is needed. Generally, performing additional steps (i.e., performing an additional process) within a semiconductor fabrication process costs more than adding a process to the back end process (like packaging).

Another problem with the foregoing approach is illustrated in FIG. 1: the die 10 tends to decouple from the heatspreader 12 (in FIG. 1, reference numeral 14 identifies the substrate). Generally, the larger the die, the higher the die backside warpage. Since the die is free to bend and warp, the contact between the die and the heatspreader is reduced, thereby decreasing the thermal performance.

As such, the foregoing approach provides the following disadvantages:

1) the cost of adding a process to the overall semiconductor fabrication process is high; and
2) the die tends to warp and decouple from the heatspreader, resulting in a reduction in thermal performance.

OBJECTS AND SUMMARY

An object of an embodiment of the present invention is to provide a semiconductor package construction aimed at improving thermal performance.

Another object of an embodiment of the present invention is to provide a semiconductor package construction which effectively removes the necessity of coating the die, thereby reducing the cost of fabrication.

Still another object of an embodiment of the present invention is to provide a semiconductor package construction which effectively reduces die backside warpage, thereby providing that the die remains in good contact with the heatspreader.

Briefly, and in accordance with at least one of the foregoing objects, a heatspreader is provided as having a metal alloy preform attached to it already. Then, a few dots of conductive epoxy are dispensed around the die. The heatspreader with the preformed metal alloy is pressed on the adhesive and then the part is cured. By coupling the die to the heatspreader with conductive epoxy, the die is constrained from warping. By removing the necessity of coating the die, the cost of fabrication is reduced. There is only a very marginal cost increase in the back end for dispensing the dots. For this, the process and equipment already exists in the backend. By reducing die backside warpage, the die remains in good contact with the heatspreader, thus improving thermal performance.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
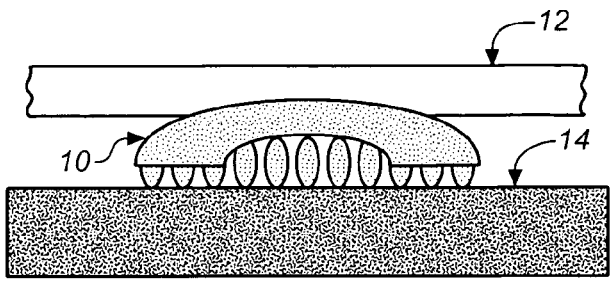
FIG. 1 illustrates a flipchip semiconductor construction which is in accordance with the prior art.

While the invention may be susceptible to embodiment in different forms, there is shown in the drawings, and herein will be described in detail, a specific embodiment of the invention. The present disclosure is to be considered an example of the principles of the invention, and is not intended to limit the invention to that which is illustrated and described herein.

In the prior art, to have a metal between the heatspreader and the die as thermal conductor and have all three stick together, a coating must be provided on the back side of the die. Without the coating, the metal alloy between the heatspreader and the die will come off the die. This coating is expensive. To overcome this, the present invention introduces conductive adhesive dots to hold the heatspreader, metal alloy and the die in place.

Figure 2:
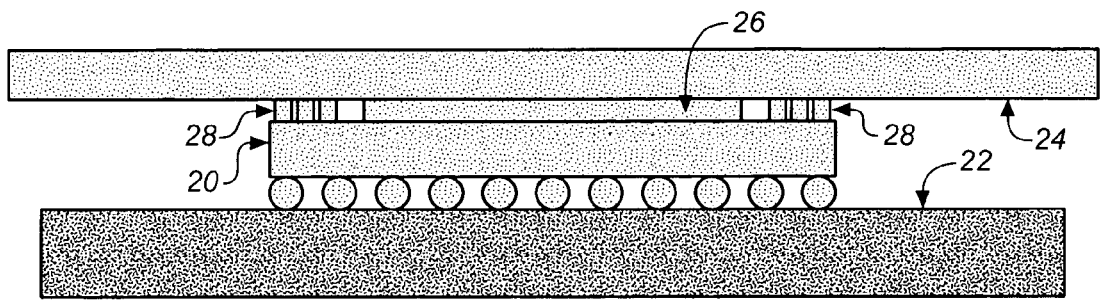
FIG. 2 illustrates a flipchip semiconductor construction which is in accordance with an embodiment of the present invention.

FIG. 2 illustrates a flipchip semiconductor construction which is in accordance with an embodiment of the present invention. The construction is aimed at improving thermal performance. The construction does so while removing the necessity of coating the die, thereby reducing the cost of fabrication. The construction also reduces die backside warpage, thereby providing that the die remains in good contact with the heatspreader.

As shown in FIG. 2, the construction provides that a die 20 is disposed on a substrate 22, and that a heatspreader 24 is provided having a metal alloy preform 26, i.e., a metal layer, attached to it already. The metal alloy 26 may be a solder deposit. The metal alloy 26 is in contact with the die 20, and an adhesive 28 (preferably a conductive epoxy) is disposed between the die 20 and the heatspreader 24, thereby bonding the die 20 to the heatspreader 24 with the metal layer 26 being disposed between the die 20 and the heatspreader 24. As shown, preferably the conductive epoxy 28 is disposed next to the metal layer 26 on the heatspreader 24.

Figure 3:
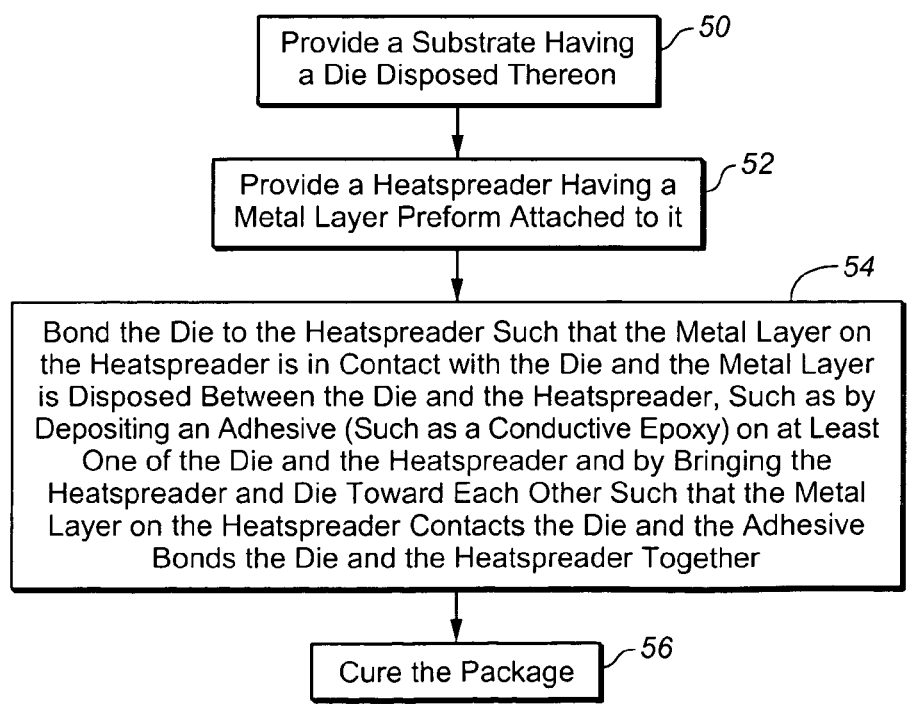
FIG. 3 illustrates a method of constructing the package shown in FIG. 2, wherein the method is in accordance with an embodiment of the present invention.

FIG. 3 illustrates a method of constructing the package shown in FIG. 2, wherein the method is in accordance with an embodiment of the present invention. Initially, the substrate 22 is provided, having the die 20 disposed thereon (box 50 in FIG. 3), and the heatspreader 24 is provided, having the metal alloy preform 26 attached to it (box 52 in FIG. 3). Then, a few dots of adhesive 28 (preferably conductive epoxy) are dispensed around the die 20, the heatspreader 24 with the preformed metal alloy 26 is brought toward the die 20, and the heatspreader 24 is pressed on the adhesive 28 (box 54 in FIG. 3). Finally, the part is cured (box 56 in FIG. 3).

By removing the necessity of coating the die, the cost of fabrication is reduced. In fact, there is only very marginal cost increase in the back end for dispensing the dots. For this, the process and equipment already exists in the back-end. Additionally, by coupling the die to the heatspreader with conductive epoxy, the die is constrained from warping. Hence, the die remains in good contact with the heatspreader, and thermal performance is improved.

While embodiments of the present invention are shown and described, it is envisioned that those skilled in the art may devise various modifications of the present invention without departing from the spirit and scope of the appended claims.

What is claimed is:

1. A semiconductor package comprising: a substrate; a die on the substrate; a heatspreader; a metal layer on a portion of the heatspreader, said metal layer being in contact with a portion of the die, said heatspreader and said die having a space therebetween; and an adhesive disposed in the space between the die and the heatspreader disposed next to the metal layer on the heatspreader, thereby bonding the die to the heatspreader with the metal layer being disposed between the die and the heatspreader.

2. A semiconductor package as recited in claim 1, wherein the metal layer on the heatspreader comprises a solder deposit.

3. A semiconductor package as recited in claim 1, wherein the metal layer on the heatspreader comprises a metal alloy.

4. A semiconductor package as recited in claim 1, wherein the adhesive comprises a conductive adhesive.

5. A semiconductor package as recited in claim 1, wherein the adhesive comprises a conductive epoxy.

6. A semiconductor package as recited in claim 5, wherein the conductive epoxy is disposed next to the metal layer on the heatspreader.

7. A semiconductor package as recited in claim 1, wherein the adhesive is disposed next to, but not on, the metal layer on the heatspreader.

8. A method of constructing a semiconductor package to improve thermal performance, said method comprising:

providing a substrate having a die disposed thereon;

providing a heatspreader having a metal layer disposed on a portion thereof;

providing an adhesive between the die and the heatspreader next to the metal layer on the heatspreader;

bonding the die to the heatspreader such that the metal layer on the heatspreader is in adhesive contact with the die and the metal layer is disposed between the die and the heatspreader but is not adhered to the die.

9. A method as recited in claim 8, wherein the step of bonding the die to the heatspreader comprises depositing an adhesive on at least one of the die and the heatspreader.

10. A method as recited in claim 9, further comprising bringing the heatspreader and die toward each other such that the metal layer on the heatspreader contacts the die and the adhesive bonds the die and the heatspreader together with the metal layer being disposed between the die and the heatspreader.

11. A method as recited in claim 8, wherein the step of bonding the die to the heatspreader comprises depositing a conductive adhesive on at least one of the die and the heatspreader.

12. A method as recited in claim 11, further comprising bringing the heatspreader and die toward each other such that the metal layer on the heatspreader contacts the die and the conductive adhesive bonds the die and the heatspreader together with the metal layer being disposed between the die and the heatspreader.

13. A method as recited in claim 8, wherein the step of bonding the die to the heatspreader comprises depositing a conductive epoxy on at least one of the die and the heatspreader.

14. A method as recited in claim 13, further comprising bringing the heatspreader and die toward each other such that the metal layer on the heatspreader contacts the die and the conductive epoxy bonds the die and the heatspreader together with the metal layer being disposed between the die and the heatspreader.

* * * * *